(12) United States Patent
Kang et al.

(10) Patent No.: US 8,828,845 B2
(45) Date of Patent: Sep. 9, 2014

(54) METHOD OF FABRICATING OXIDE THIN FILM DEVICE USING LASER LIFT-OFF AND OXIDE THIN FILM DEVICE FABRICATED BY THE SAME

(71) Applicant: Korea Institute of Science and Technology, Seoul (KR)

(72) Inventors: Chong Yun Kang, Seoul (KR); Seok Jin Yoon, Seoul (KR); Young Ho Do, Seoul (KR); Ji Won Choi, Seoul (KR); Seung Hyub Baek, Seoul (KR); Hyun Cheol Song, Seoul (KR); Jin Sang Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 13/713,396

(22) Filed: Dec. 13, 2012

(65) Prior Publication Data
US 2013/0334522 A1    Dec. 19, 2013

(30) Foreign Application Priority Data
Jun. 13, 2012    (KR) .................. 10-2012-0063205

(51) Int. Cl.
  $H01L\ 21/30$    (2006.01)
  $H01L\ 21/02$    (2006.01)
  $H01L\ 29/22$    (2006.01)
  $H01L\ 41/31$    (2013.01)

(52) U.S. Cl.
  CPC .......... $H01L\ 21/02565$ (2013.01); $H01L\ 29/22$ (2013.01); $H01L\ 41/31$ (2013.01)
  USPC ............ 438/458; 257/E21.122; 257/E21.567; 438/455; 438/795

(58) Field of Classification Search
  USPC ........... 257/E21.122, E21.567; 438/455, 458, 438/795
  See application file for complete search history.

(56) References Cited

U.S. PATENT DOCUMENTS

2009/0223706 A1 *    9/2009    Lee et al. .................. 174/260

FOREIGN PATENT DOCUMENTS

KR    1020070068530 A    7/2007

OTHER PUBLICATIONS

Al-Shareef et al., "Tunability and Calculation of the Dielectric Constant of Capacitor Structures with Interdigital Electrodes", Journal of Electroceramics. 1:2, pp. 145-153 (1997).*
Choong Hee Lee, et al; "Use of laser lift-off for flexible device applications", Journal of Applied Physics, vol. 108, pp. 102814-1-102814-5, published online Nov. 24, 2010.

* cited by examiner

Primary Examiner — Asok K Sarkar
(74) Attorney, Agent, or Firm — Ladas & Parry LLP

(57) ABSTRACT

Provided is a method of fabricating an oxide thin film device using laser lift-off and an oxide thin film device fabricated by the same. The method includes: forming an oxide thin film on a growth substrate; bonding a temporary substrate on the oxide thin film; irradiating laser onto the growth substrate to separate the oxide thin film on which the temporary substrate has been bonded from the growth substrate; bonding a device substrate on the oxide thin film on which the temporary substrate has been bonded; and forming an upper electrode film on the oxide thin film. Therefore, it is possible to overcome problems caused by a defective layer by transferring an oxide thin film transferred on a polymer-based temporary substrate onto a device substrate, without using an interface on which a defective layer formed due to oxygen diffusion upon laser lift-off is formed.

10 Claims, 2 Drawing Sheets

METHOD OF FABRICATING OXIDE THIN FILM DEVICE USING LASER LIFT-OFF AND OXIDE THIN FILM DEVICE FABRICATED BY THE SAME

CROSS-REFERENCE TO RELATED APPLICATION

This application claims priority to and the benefit of Korean Patent Application No. 2012-0063205, filed on Jun. 13, 2012, the disclosure of which is incorporated herein by reference in its entirety.

BACKGROUND

1. Field of the Invention

The present invention relates to a method of fabricating an oxide thin film device using laser lift-off and an oxide thin film device fabricated by the same, and more particularly, to a method of fabricating an oxide thin film device using laser lift-off by transferring an oxide thin film transferred on a polymer-based temporary substrate onto a device substrate, without using an interface on which a defective layer formed due to oxygen diffusion upon laser lift-off is formed, and an oxide thin film device fabricated by the method.

2. Discussion of Related Art

With the rapid development of electronic technologies in the past decade, device miniaturization and power consumption reduction are being accelerated. In order to develop new power capable of replacing typical discardable batteries, studies into a piezoelectric substance capable of converting mechanical energy, such as pressure, force, vibration, etc., into electrical energy are being actively conducted.

As a result of the studies, piezoelectric harvesting technology has been developed. Piezoelectric harvesting technology is expected to be able to be developed as self power source for USN (ubiquitous sensor network), a portable device, etc. Also, by fabricating self power sources in the form of a flexible thin film device, diversification and expansion of use of self power sources are expected. Accordingly, requirement for development of a flexible piezoelectric energy harvesting technology is greatly increasing.

A flexible device is fabricated by preparing an organic substrate such as a polymer substrate since the flexible device requires flexibility, and forming an organic thin film as a thin film configuring a functional part on the organic substrate. However, since a functional part implemented as an organic thin film cannot ensure high performance, the functional part of a flexible device needs to be implemented with an inorganic material. In this case, there are difficulties in directly applying a high-temperature growth process for a piezoelectric substance to a flexible substrate which is made of an organic material. Accordingly, a thin film transfer technique of growing a thin film formed with an inorganic material such as an oxide thin film on a growth substrate and then transferring the thin film on an organic substrate is used.

Also, generally, a thin film transfer technique requires a process of separating a substrate after forming layers. In detail, in order to separate a transferred thin film from a donor substrate, the thin film is bonded on an acceptor substrate and then separated from the donor substrate using a laser lift-off process. However, the laser lift-off process has a problem in that the laser makes a defective layer on the surface of a transferred thin film device, and the defective layer may deteriorate device properties.

Korean Published Patent No. 2007-0068530 (Applicant: Samsung Electronics Co., Ltd, Publishing Date: Jul. 2, 2007) discloses a method of fabricating a substrate for an electronic or optoelectronic device using a GaN based semiconductor, comprising the steps of: forming a first epitaxial layer structure made of a group III nitride-based material on a sapphire substrate which is an initial growth substrate; depositing a thick film layer having a thickness of 30 micrometers or more on the first epitaxial layer; removing the sapphire substrate through a laser lift-off scheme; and treating a surface of the first epitaxial layer structure by dry etching the first epitaxial layer structure.

Meanwhile, C. H. Lee et. al. "Use of Laser Lift-off for Flexible Device Applications", Journal of Applied Physics, 108, 102814 (2010) discloses a method of fabricating a flexible device using a PLZT thin film, comprising the steps of: forming an oxide thin film on a growth substrate; forming an electrode layer on the oxide thin film; bonding a device substrate on the electrode layer; irradiating a laser beam onto the growth substrate to separate the oxide thin film on which the device substrate has been bonded; treating a surface of the separated oxide thin film using an ion milling method; and forming an electrode layer on the oxide thin film to thereby fabricate a thin film device.

The surface treatment method using ion milling and dry etching is to remove a defective layer formed due to oxygen diffusion upon laser lift-off. However, since the method performs etching only with respect to the defective layer, it may cause another defect due to the physical damages of a device thin film so that the thin film loses its own physical properties. Due to this problem, it is difficult to fabricate a thin film device having excellent physical properties. Also, the fabrication process becomes complicated, and selective etching is difficult.

The present inventors have found that the problem caused by the defective layer formed due to oxygen diffusion upon laser lift-off can be resolved by using a method of fabricating an oxide thin film device using laser lift-off by transferring an oxide thin film transferred on a polymer-based temporary substrate onto a device substrate, without using an interface on which a defective layer formed due to oxygen diffusion upon laser lift-off is formed.

PRIOR ART REFERENCE

Korean Published Patent No. 2007-0068530
C. H. Lee et. al. "Use of Laser Lift-off for Flexible Device Applications", Journal of Applied Physics, 108, 102814 (2010)

SUMMARY OF THE INVENTION

The present invention is directed to a method of fabricating an oxide thin film device using laser lift-off by transferring an oxide thin film transferred on a polymer-based temporary substrate onto a device substrate, without using an interface on which a defective layer formed due to oxygen diffusion upon laser lift-off is formed.

The present invention is also directed to an oxide thin film device fabricated by the method described above.

According to an aspect of the present invention, there is provided a method of fabricating an oxide thin film device, including: forming an oxide thin film on a growth substrate; bonding a temporary substrate on the oxide thin film; irradiating laser onto the growth substrate to separate the oxide thin film on which the temporary substrate has been bonded from the growth substrate; bonding a device substrate on the oxide thin film on which the temporary substrate has been bonded; and forming an upper electrode film on the oxide thin film.

The growth substrate may have an energy band gap that is greater than energy corresponding to a wavelength of the laser.

A crystalline structure of the oxide thin film at the interface between the oxide film and growth substrate may be amorphized and decomposed by the irradiation of the laser, and the energy band gap of the oxide thin film may be lower than the energy corresponding to a wavelength of the laser and the energy band gap of the growth substrate.

The oxide thin film may be formed of at least one material selected from a group consisting of Perovskite materials including lead zirconium titanate (PZT), lanthanum-doped lead zirconate titanate (PLZT), strontium bismuth tantalite (SBT), strontium barium tantalate noibate (SBTN), bismuth titanate (BIT), bismuth lanthanum titanate (BLT), lead magnesium niobate-lead titanate (PMN-PT), and lead zinc niobate-lead titanate (PZN-PT), and binary oxides including Zinc oxide (ZnO), Magnesium oxide (MgO), and Cadmium oxide (CdO).

The temporary substrate may be made of a material selected from a group consisting of polydimethylsiloxane (PDMS), polymethylmethacrylate (PMMA), polycarbonate, polycyclic olefine, polyimide, and polyurethane.

The energy of the laser may be between band gap of the growth substrate and band gap of the oxide thin film.

The device substrate may be a semiconductor substrate, an oxide substrate, or a flexible substrate.

The upper electrode film may be formed of at least one material selected from a group consisting of platinum (Pt), gold (Au), aluminum (Al), copper (Cu), titanium (Ti), and their alloys, and a group consisting of TiN, WN, $In_2O_3$:Sn (ITO), $SnO_2$:F(FTO), $SrTiO_3$, and $LaNiO_3$. The upper electrode film may have an interdigital electrode (IDE) pattern.

According to another aspect of the present invention, there is provided an oxide thin film device fabricated by a method of fabricating an oxide thin film device, including: forming an oxide thin film on a growth substrate; bonding a temporary substrate on the oxide thin film; irradiating laser onto the growth substrate to separate the oxide thin film on which the temporary substrate has been bonded from the growth substrate; bonding a device substrate on the oxide thin film on which the temporary substrate has been bonded; and forming an upper electrode film on the oxide thin film.

The oxide thin film device may be one of a thin film transistor (TFT), a piezoelectric device, a solar cell, and a bio sensor.

Accordingly, it is possible to overcome problems related to a defective layer by transferring an oxide thin film transferred on a polymer-based temporary substrate onto a device substrate, without using an interface on which a defective layer formed due to oxygen diffusion upon laser lift-off is formed.

Also, by implementing an oxide thin film device with planar type on which upper electrodes have been formed, application to various types of devices and substrates is possible, which is expected to contribute to the development of a functionalized flexible thin film device.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Figure 1:
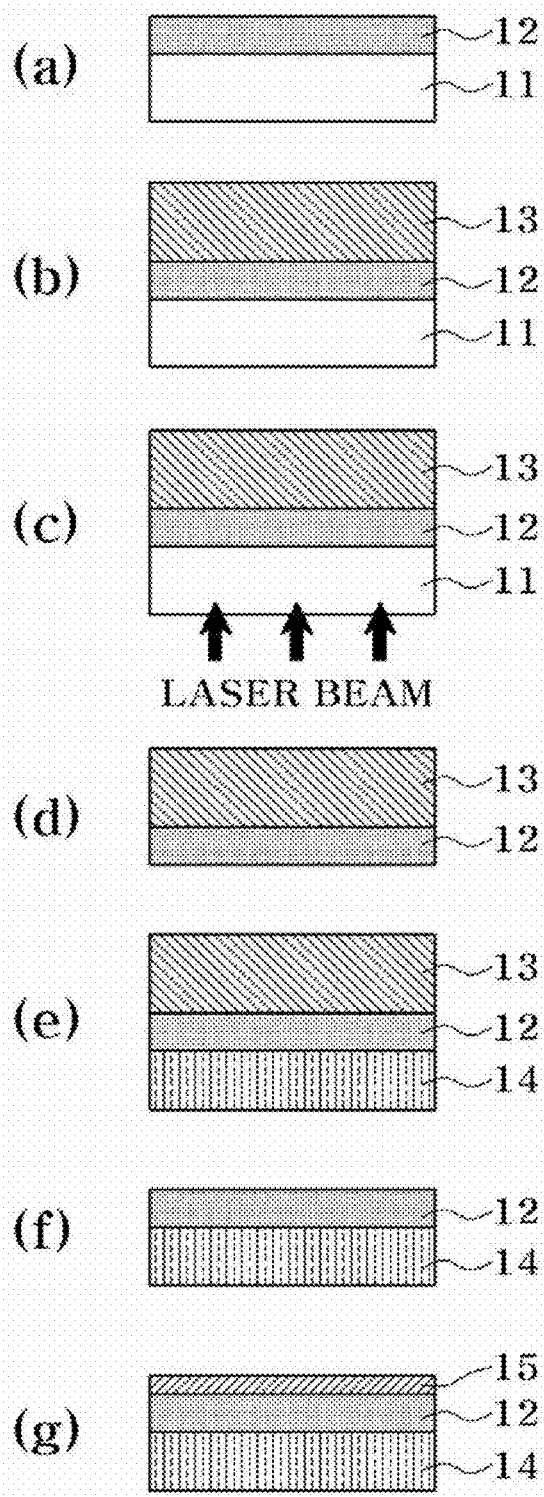
FIG. 1 is a view for explaining a method of forming a thin film device according to an embodiment of the present invention, wherein (a) is a cross-sectional view of a growth substrate with an oxide thin film formed thereon, (b) is a cross-sectional view of a structure in which a temporary substrate has been bonded on the oxide thin film, (c) is a cross-sectional view illustrating a state where a laser beam is irradiated to the growth substrate, (d) is a cross-sectional view of a structure in which the growth substrate has been separated from the structure of (c), (e) is a cross-sectional view of a structure in which a device substrate has been bonded to the structure of (d), (f) is a cross-sectional view of a structure in which the temporary substrate has been separated from the structure of (e), and (g) is a cross-sectional view of a thin film device with an upper electrode film formed thereon.

FIG. 1 is a view for explaining a method of forming a thin film device, according to an embodiment of the present invention, As shown in (a) of FIG. 1, a growth substrate 11 through which a laser beam is transmittable is prepared, and an oxide thin film 12 is formed on the growth substrate 11.

The growth substrate 11 through which a laser beam is transmittable may be preferably made of a material whose band gap is 0.5 eV or more greater than the energy corresponding to the wavelength of the laser beam. More preferably, the growth substrate 11 may be a transparent substrate made of a material whose band gap is 1 eV or more greater than the energy corresponding to the wavelength of the laser beam.

Also, the growth substrate 11 may be a substrate suitable for forming an oxide thin film thereon. In detail, the growth substrate 11 may preferably have thermal endurance suitable for high temperature growth conditions required in a process for forming an oxide thin film having excellent physical properties, and more preferably, the growth substrate 11 has the same or similar lattice constant and crystal structure as those of the oxide thin film. If the growth substrate 11 has the same or similar lattice constant and crystal structure as those of the oxide thin film, the oxide thin film can be easily crystallized when it is grown, so that the thin film properties of the oxide thin film are improved. As a result, it is possible to form an oxide thin film having excellent properties for a flexible oxide thin film device (which will be described later), and to improve the crystallinity of the oxide thin film formed on the growth substrate 11.

For example, the growth substrate 11 may be a rigid substrate made of $Al_2O_3$, MgO, quartz, glass, or $ZrO_2$.

The oxide thin film 12 may be formed of an arbitrary oxide whose crystalline structure can be amorphized and decomposed by laser irradiation and which has an energy band gap that is 0.1 eV or more lower than the energy band gap of the growth substrate 11.

For example, the oxide thin film 12 may be formed of at least one material selected from a group consisting of Perovskite materials including PZT (lead zirconium titanate: $Pb(Zr_xTi_{1-x})O_3$, $0<x<1$), PLZT (lanthanum-doped lead zirconate titanate: $PbyLa1-y(ZrxTi1-x)O_3$, $0<x<1$, $0<y<0.5$), SBT (strontium bismuth tantalite: $SrBi_2Ta_2O_9$), SBTN (strontium barium tantalate noibate), BIT (bismuth titanate $Bi_4Ti_3O_{12}$), BLT (bismuth lanthanum titanate: $Bi_4$-$xLaxTi_3O_{12}$, $0<x<0.5$), PMN-PT (lead magnesium niobate-lead titanate), and PZN-PT (lead zinc niobate-lead titanate), and binary oxides including ZnO (Zinc oxide), MgO (Magnesium oxide), and CdO (Cadmium oxide). Preferably, the oxide thin film 12 may include PZT or ZnO.

The oxide thin film 12 may be deposited by physical vapor deposition (PVD), chemical vapor deposition (CVD), sputtering, pulsed laser deposition (PLD), thermal evaporation, electron beam evaporation, atomic layer deposition (ALD), molecular beam epitaxy (MBE), a sol-gel process, etc., and then, the deposited oxide thin film 12 may be subject to heat treatment so that the resultant oxide thin film 12 can have excellent physical properties.

Conditions for forming the oxide thin film 12 may depend on growth method and material forming the oxide thin film 12. However, the oxide thin film 12 may be preferably formed under conditions well-known in the related technical field, and after heat treatment may also be performed under conditions that have been generally used in the related technical field. The thickness of the oxide thin film 12 may depend on thin film transfer process conditions. For example, the oxide thin film 12 may be formed to a thickness in the range of 300 nm to 200 μm.

Then, as shown in (b) of FIG. 1, a polymer-based temporary substrate 13 is bonded on the oxide thin film 12. The polymer-based temporary substrate 13 may be preferably formed to a thickness of 1 mm through 3 cm. Since the temporary substrate 13 itself has appropriate viscosity allowing thin film bonding, the temporary substrate 13 may be bonded on the oxide thin film 12 by a method generally used in the related technical art.

The polymer-based temporary substrate 13 may be made of a material selected from a group consisting of polydimethylsiloxane (PDMS), polymethylmethacrylate (PMMA), polycarbonate, polycyclic olefine, polyimide, and polyurethane. Preferably, the polymer-based temporary substrate 13 may be made of PDMS.

Then, as shown in (c) of FIG. 1, a laser beam is irradiated onto the growth substrate 11. If the laser beam is irradiated onto the growth substrate 11, the crystalline structure of the interface between the growth substrate 11 and the oxide thin film 12 is amorphized and decomposed.

The kind of laser and method of irradiating the laser beam are not limited. The laser may be arbitrary laser having energy between the band gap of the growth substrate 11 and the band gap of the oxide thin film 12. For example, the laser may be excimer laser (126 nm, 146 nm, 157 nm, 172 nm, 175 nm, 193 nm, 248 nm, 282 nm, 308 nm, 351 nm, 222 nm, 259 nm) or Nd-YAG laser (266 nm, 355 nm). If the oxide thin film 12 is made of PZT, laser having a wavelength of 248 nm may be preferably used. Meanwhile, if the energy of the laser is greater than the band gap of the growth substrate 11, the laser will fail to pass through the growth substrate 11 and will be absorbed in the growth substrate 11, which makes transfer of the oxide thin film 12 impossible. Also, if the energy of the laser is smaller than the band gap of the oxide thin film 12, the laser will fail to be absorbed in the oxide thin film 12 and will pass through the oxide thin film 12, which also makes transfer of the oxide thin film 12 impossible.

Then, as shown in (d) of FIG. 1, the interface between the growth substrate 11 and the oxide thin film 12 is amorphized and decomposed by the irradiation of the laser beam, so that the growth substrate 11 is separated from the oxide thin film 12.

Then, as shown in (e) of FIG. 1, a device substrate 14 is bonded on the separated oxide thin film 12. The term "device substrate" used in this specification represents a substrate which is provided as a transfer body and configures a thin film device.

The device substrate 14 may include a semiconductor substrate, an oxide substrate, or a flexible substrate made of a polymer material. Preferably, the device substrate 14 may be a flexible substrate. Here, the flexible substrate can be understood as a substrate (for example, a plastic substrate, etc.) that is bendable at a predetermined angle, unlike a conventional rigid substrate. The flexible substrate may be made of a material selected from a group consisting of polyimide (PI), polyetheretherketone (PEEK), polyethersulfone (PES), polyetherimide (PEI), polycarbonate (PC), polyethylenenaphthalate (PEN), and polyethylene terephthalate (PET).

A method of bonding the device substrate 14 includes all kinds of chemical, thermal, and physical bonding methods. Preferably, the device substrate 14 may be bonded using polymer-based epoxy to ensure flexibility.

Then, as shown in (f) of FIG. 1, the oxide thin film 12 and the device substrate 14 are separated from the temporary substrate 13. The method of separating the temporary substrate 13 from the oxide thin film 12 includes methods using physical forces, methods using chemical reactions, etc.

Successively, as shown in (g) of FIG. 1, an upper electrode film 15 is formed on the oxide thin film 12. The upper electrode film 15 is formed of at least one material selected from a group consisting of platinum (Pt), gold (Au), aluminum (Al), copper (Cu), titanium (Ti), and their alloys, a nitride electrode material including TiN, WN, etc., and an oxide electrode material including $In_2O_3$:Sn(ITO), $SnO_2$:F(FTO), $SrTiO_3$, $LaNiO_3$, etc.

The upper electrode film 15 may be formed using one of various deposition processes, and the deposition processes includes physical vapor deposition (PVD), chemical vapor deposition (CVD), sputtering, pulsed laser deposition (PLD), thermal evaporation, electron beam evaporation, atomic layer deposition (ALD), and molecular beam epitaxy (MBE). The upper electrode film 15 may be formed to a thickness that has been generally used in the related technical art. For example, the upper electrode film 15 may be formed to a thickness in the range of 50 nm to 200 nm.

Then, the upper electrode film 15 is patterned using a shadow mask or by a dry etching method. The upper electrode film 15 may be formed in various patterns, and preferably, the upper electrode film 15 may be formed in an interdigital electrode (IDE) pattern.

The oxide thin film device fabricated by the method as described above may be an oxide thin film device with planar type on which upper electrode pairs have been formed. Also, the oxide thin film device may be formed as various types of devices according to the kind of the oxide thin film. Preferably, the oxide thin film device may be a flexible device, however, the oxide thin film device is not limited to the flexible device. For example, the oxide thin film device may be a photoelectric transformation device, such as a thin film transistor (TFT), a piezoelectric device, a solar cell, an optical sensor, etc.

Hereinafter, an example of the present invention will be described in detail, however, the present invention is not limited to the example that will be described below.

Example

Figure 2:
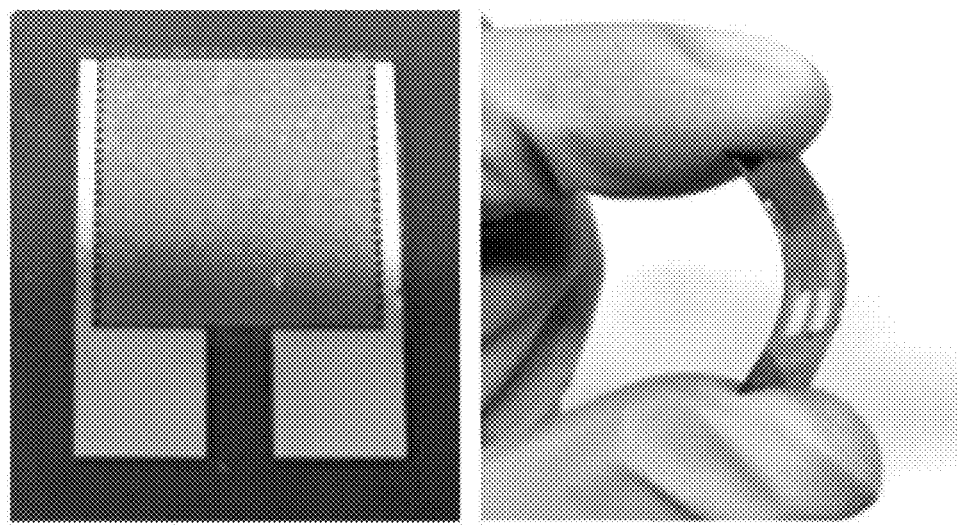
FIG. 2 is pictures of a flexible piezoelectric energy harvesting device according to an implementation example of the present invention.
Figure 3:
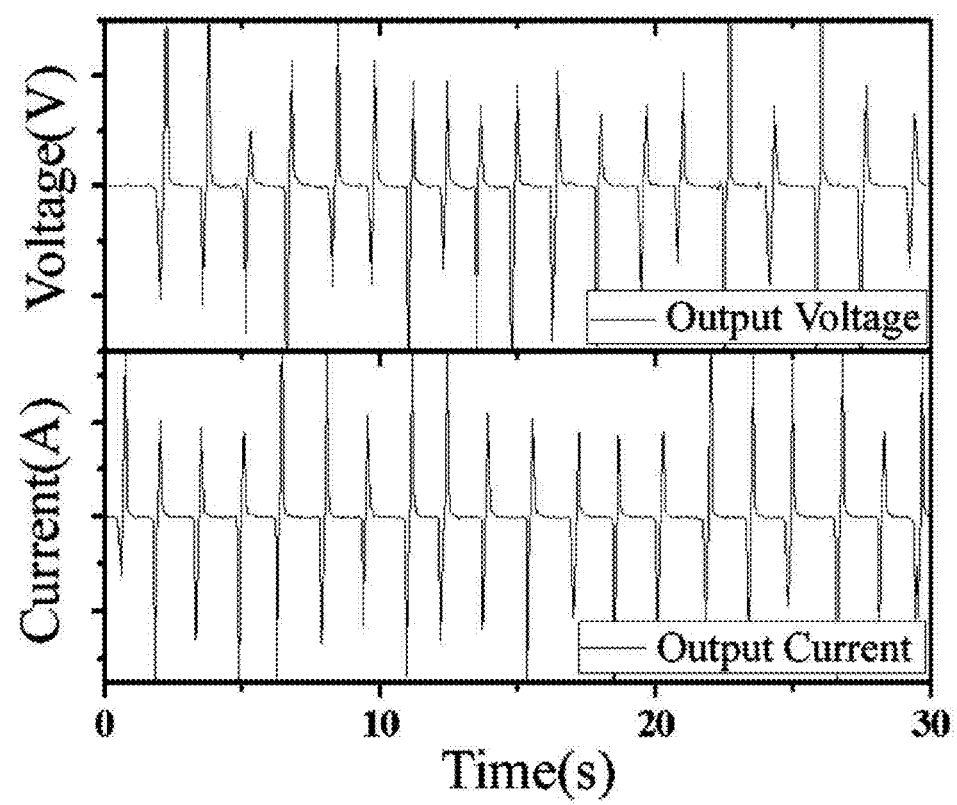
FIG. 3 is graphs showing the output voltage and current of the flexible piezoelectric energy harvesting device of FIG. 2.

A PZT thin film is formed on an alumina substrate which is a growth substrate. The PZT thin film is formed at 400° C. to a thickness of 2 μm, using a PVD method. Then, the alumina substrate with the PZT thin film formed thereon is subject to heat treatment at 650° C. for 10 minutes under an oxygen environment. Successively, a temporary substrate made of polydimethylsiloxane (PDMS), having a thickness of 2 cm, is bonded on the upper surface of the PZT thin film. Next, excimer laser having a wavelength of 298 nm is irradiated onto the alumina substrate to amorphize and decompose the crystalline structure of the interface part between the alumina substrate and the PZT thin film, so that the alumina substrate is separated from the PZT thin film. Successively, a flexible substrate which is a device substrate, is bonded on the PZT thin film. Then, the temporary substrate is separated from the PZT thin film by a physical method. Successively, an upper electrode film is formed on the PZT thin film. The upper electrode film is made of Pt and formed to a thickness of 100 nm. Then, the upper electrode film is patterned in an interdigital electrode (IDE) shape, thereby fabricating a flexible piezoelectric energy harvesting device as shown in FIG. 2. The results of measurement of the output voltage and current of the piezoelectric energy harvesting device when the pressure is applied to the device are shown in FIG. 3.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A method of fabricating an oxide thin film device, comprising:
   forming an oxide thin film on a growth substrate;
   bonding a temporary substrate on the oxide thin film;
   irradiating laser onto the growth substrate to separate the oxide thin film on which the temporary substrate has been bonded from the growth substrate;
   bonding a device substrate on the oxide thin film on which the temporary substrate has been bonded; and
   forming an upper electrode film on the oxide thin film.

2. The method of claim 1, wherein the growth substrate has an energy band gap that is greater than energy corresponding to a wavelength of the laser.

3. The method of claim 1, wherein a crystalline structure of the oxide thin film is amorphized and decomposed by the irradiation of the laser, and the energy band gap of the oxide thin film is lower than the energy band gap of the growth substrate.

4. The method of claim 1, wherein the oxide thin film is formed of at least one material selected from a group consisting of Perovskite materials including lead zirconium titanate (PZT), lanthanum-doped lead zirconate titanate (PLZT), strontium bismuth tantalite (SBT), strontium barium tantalite noibate (SBTN), bismuth titanate (BIT), bismuth lanthanum titanate (BLT), lead magnesium niobate-lead titanate (PMN-PT), and lead zinc niobate-lead titanate (PZN-PT), and binary oxides including Zinc oxide (ZnO), Magnesium oxide (MgO), and Cadmium oxide (CdO).

5. The method of claim 1, wherein the temporary substrate is made of a material selected from a group consisting of polydimethylsiloxane (PDMS), polymethylmethacrylate (PMMA), polycarbonate, polycyclic olefine, polyimide, and polyurethane.

6. The method of claim 1, wherein energy of the laser is between the band gap of the growth substrate and the band gap of the oxide thin film.

7. The method of claim 1, wherein the device substrate is a semiconductor substrate, an oxide substrate, or a flexible substrate.

8. The method of claim 1, wherein the upper electrode film is formed of at least one material selected from a group consisting of platinum (Pt), aurum (Au), aluminum (Al), copper (Cu), titanium (Ti), and their alloys, and a group consisting of TiN, WN, $In_2O_3$:Sn(ITO), $SnO_2$:F(FTO), $SrTiO_3$, and $LaNiO_3$.

9. The method of claim 1, wherein the upper electrode film has an interdigital electrode (IDE) pattern.

10. A method of fabricating an oxide thin film device, comprising:
    forming an oxide thin film on a growth substrate, wherein the growth substrate has the same or similar lattice constant and crystal structure as those of the oxide thin film;
    bonding a temporary substrate on the oxide thin film;
    irradiating laser onto the growth substrate to separate the oxide thin film on which the temporary substrate has been bonded from the growth substrate;
    bonding a device substrate on the oxide thin film on which the temporary substrate has been bonded; and
    forming an upper electrode film on the oxide thin film.

* * * * *